United States Patent
Hahto et al.

(10) Patent No.: US 9,734,982 B1
(45) Date of Patent: Aug. 15, 2017

(54) BEAM CURRENT DENSITY DISTRIBUTION ADJUSTMENT DEVICE AND ION IMPLANTER

(71) Applicant: Nissin Ion Equipment Co., Ltd., Kyoto-shi, Kyoto (JP)

(72) Inventors: Sami K. Hahto, Nashua, NH (US); Tetsuro Yamamoto, Billerica, MA (US)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 15/162,929

(22) Filed: May 24, 2016

(51) Int. Cl.
*H01J 37/302* (2006.01)
*C23C 14/48* (2006.01)
*G21K 5/00* (2006.01)
*H01J 37/147* (2006.01)
*C23C 14/54* (2006.01)
*H01J 37/317* (2006.01)

(52) U.S. Cl.
CPC .......... *H01J 37/1472* (2013.01); *C23C 14/48* (2013.01); *C23C 14/54* (2013.01); *H01J 37/302* (2013.01); *H01J 37/3171* (2013.01); *G21K 5/00* (2013.01); *H01J 2237/1504* (2013.01); *H01J 2237/30472* (2013.01); *H01J 2237/31701* (2013.01)

(58) Field of Classification Search
CPC ..... H01J 37/1472; H01J 37/302; C23C 14/48; C23C 14/54; G21K 1/00; G21K 1/08; G21K 1/087; G21K 1/09; G21K 5/00; G21K 5/04

USPC ........ 250/492.1, 492.2, 396 R, 396 ML, 400
See application file for complete search history.

(56) References Cited

U.S. PATENT DOCUMENTS

| | | |
|---|---|---|
| 6,933,507 B2 | 8/2005 | Purser et al. |
| 7,078,714 B2 | 7/2006 | Maeno et al. |
| 7,301,156 B2 | 11/2007 | Purser et al. |
| 7,888,660 B2 | 2/2011 | Purser et al. |
| 9,142,386 B2 | 9/2015 | Hahto et al. |
| 2016/0005570 A1 | 1/2016 | Hahto et al. |

FOREIGN PATENT DOCUMENTS

| | | |
|---|---|---|
| JP | 2005-327713 A | 11/2005 |
| JP | 2005-533353 A | 11/2005 |
| JP | 2014-183042 A | 9/2014 |

*Primary Examiner* — Wyatt Stoffa
*Assistant Examiner* — Hanway Chang
(74) *Attorney, Agent, or Firm* — Sughrue Mion, PLLC

(57) ABSTRACT

A beam current density distribution adjustment device is provided. The device includes member pairs in a long side direction of a ribbon beam, the member pairs adjusting a beam current density distribution in the long side direction of the ribbon beam by using an electric field or a magnetic field, members of each of the member pairs being disposed with the ribbon beam in-between the members. Opposing surfaces of the member pairs adjacent to each other in the long side direction of the ribbon beam are partially not parallel to a traveling direction of the ribbon beam.

20 Claims, 11 Drawing Sheets

FIG. 2A
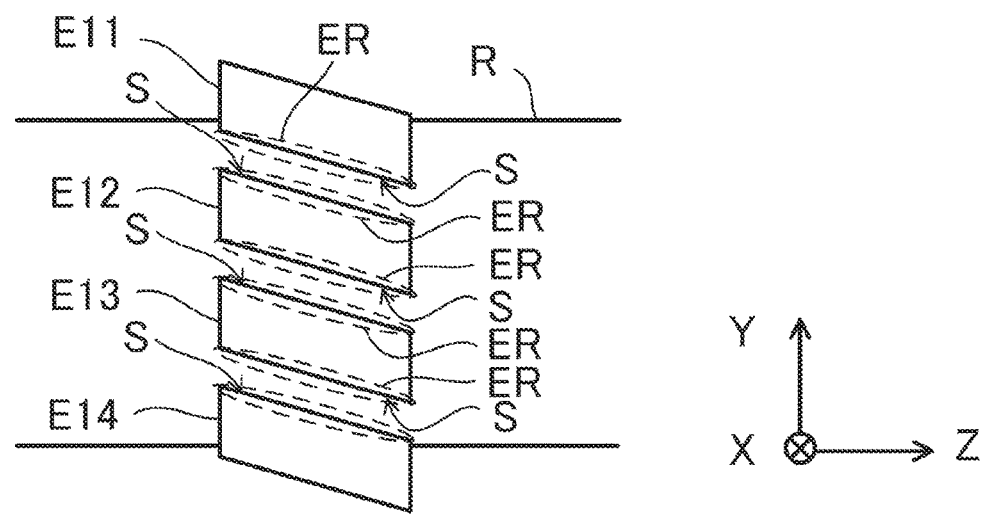
FIG. 2B  -- Prior Art --
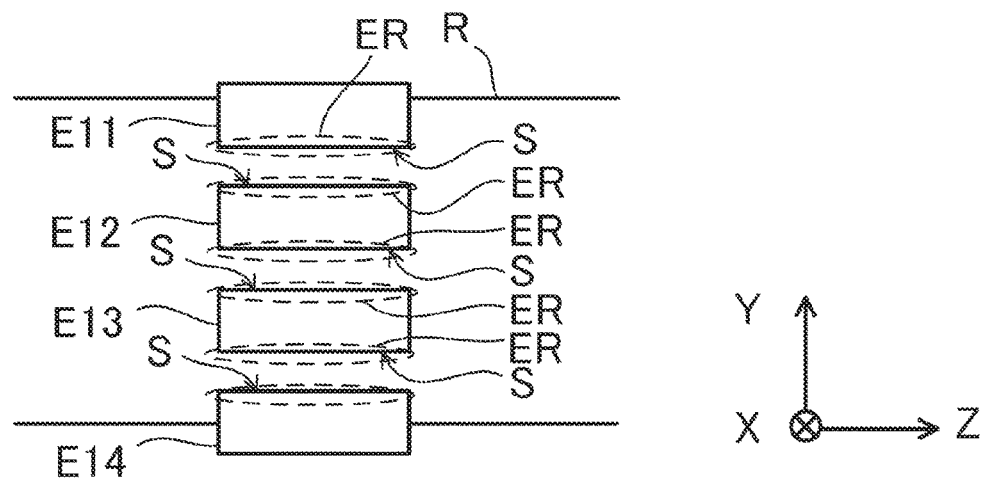

FIG. 3A
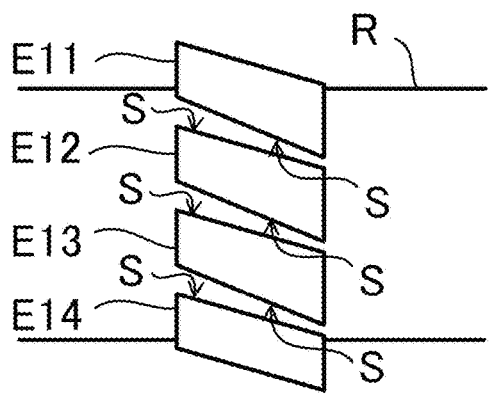
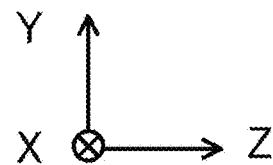
FIG. 3B
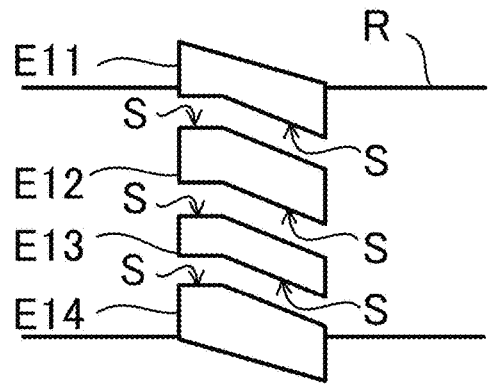
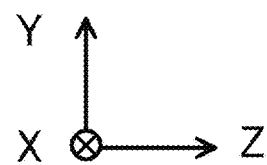
FIG. 3C
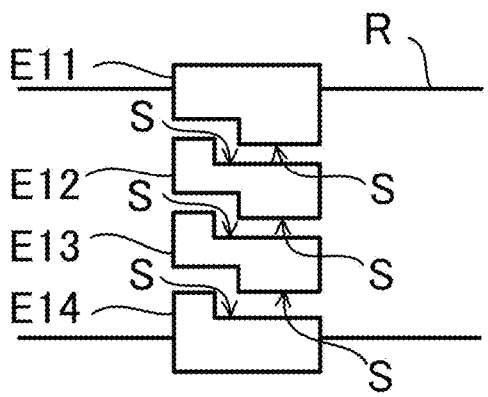
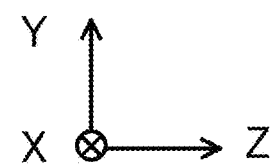
FIG. 3D
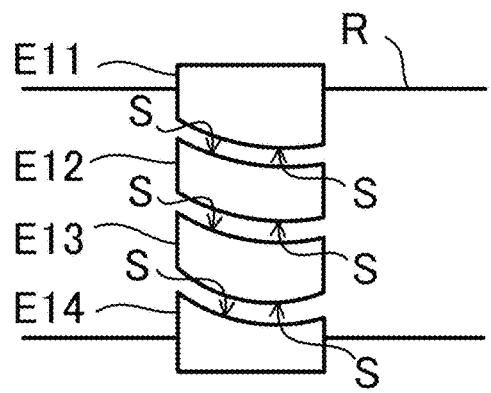
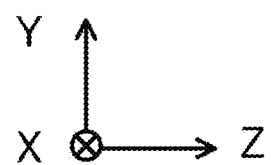

FIG. 4A
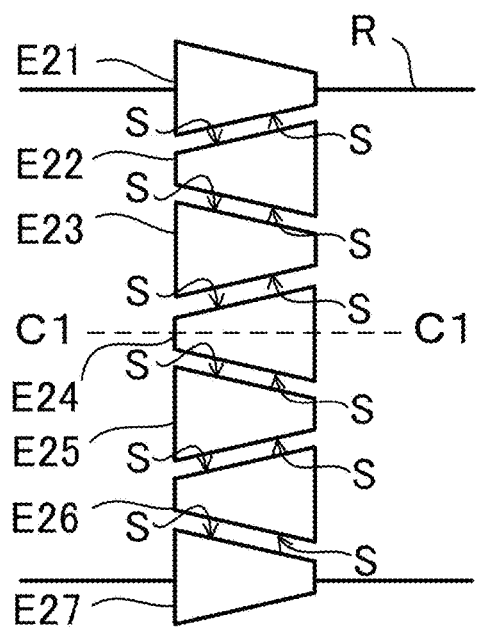
FIG. 4B
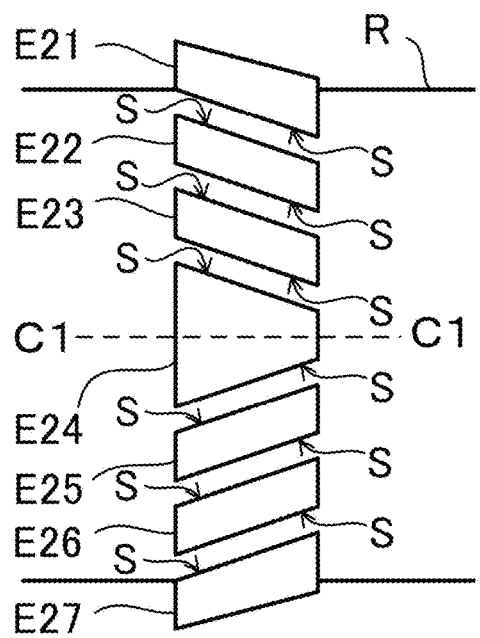
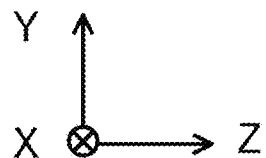
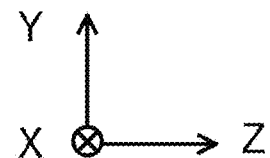

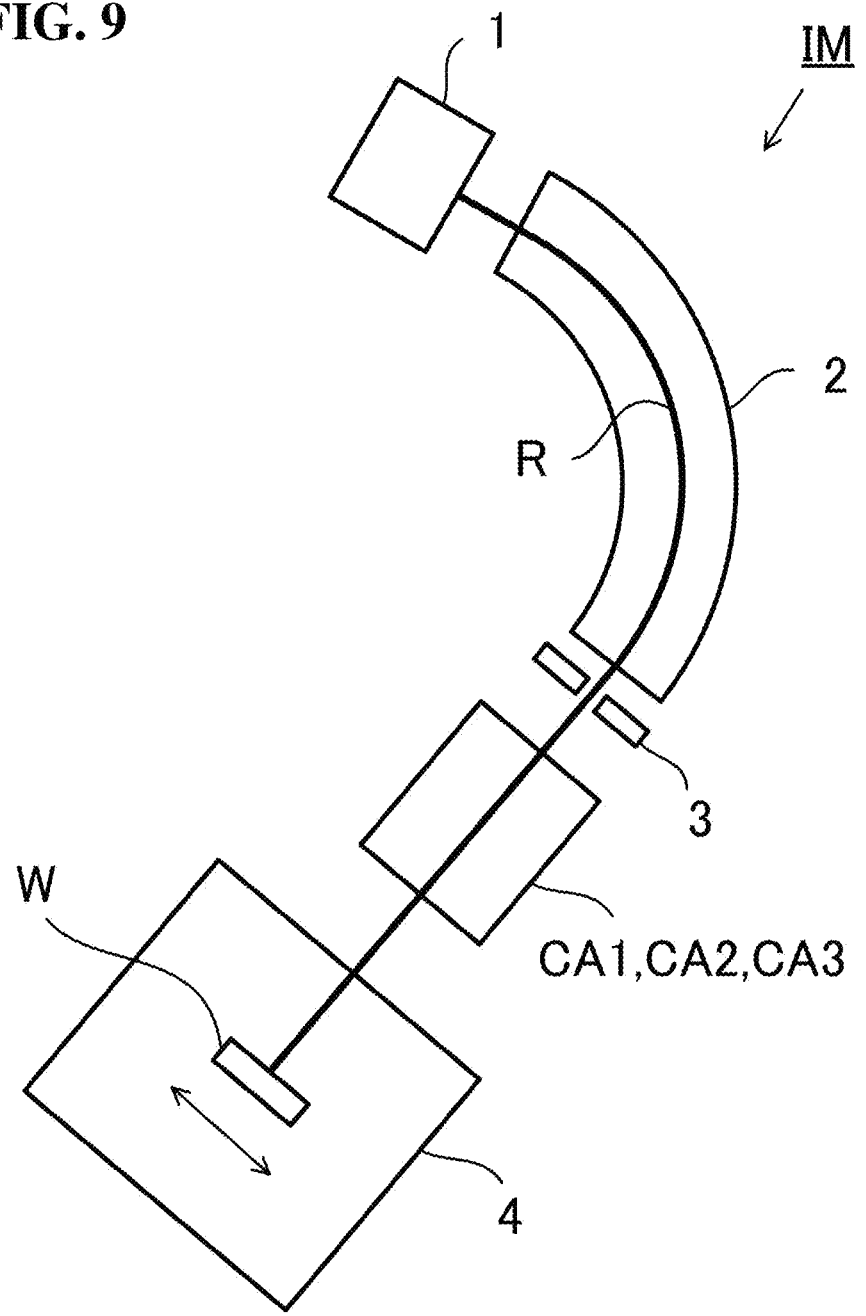

Related Art

Related Art

BEAM CURRENT DENSITY DISTRIBUTION ADJUSTMENT DEVICE AND ION IMPLANTER

BACKGROUND

1. Field

The present disclosure relates to a beam current density distribution adjustment device that locally deflects a ribbon beam to adjust beam current density distribution in a long side direction of the beam, and to an ion implanter including the beam current density distribution adjustment device.

2. Description of the Related Art

A device that uses an electric field or a magnetic field to adjust beam current density distribution in a long side direction of a ribbon beam is known.

Examples of the device using an electric field may include devices illustrated in Japanese Patent Laid-Open Application No. 2014-183042. In these devices, a plurality of electrode pairs are disposed along the long side direction of the ribbon beam. Electrodes of each of the electrode pairs are oppositely disposed with the ribbon beam in between. To locally deflect a beam component to adjust the beam current density distribution in the long side direction of the ribbon beam, voltages to be applied to respective electrode pairs that are arranged in the long side direction of the ribbon beam are adjusted.

Examples of the device using a magnetic field may include a device illustrated in Japanese Patent Laid-Open Application No. 2005-327713. In the device, a plurality of magnetic pole pairs are disposed along the long side direction of the ribbon beam. Magnetic poles of each of the magnetic pole pairs are oppositely disposed with the ribbon beam in between. Each magnetic pole is wound with a coil. To locally deflect a beam component to adjust the beam current density distribution in the long side direction of the ribbon beam, currents to the coils wound around the respective magnetic poles, of the magnetic pair, opposed to each other in a short side direction of the ribbon beam are adjusted.

Further, as the example of the device using a magnetic field, devices illustrated in the National Publication of International Patent Application No. 2005-533353 are also known. In the devices, a plurality of coils are wound around a rectangular-shaped yoke having an opening through which the ribbon beam passes. To locally deflect a beam component to adjust the beam current density distribution in the long side direction of the ribbon beam, a direction of a current flowing through the plurality of coils wound around one of opposing long shafts of the yoke is opposite to that of the other shaft, and currents to the respective coils are adjusted.

SUMMARY

According to an aspect of one or more exemplary embodiments, there is provided a beam current density distribution adjustment device comprising a plurality of member pairs in a long side direction of a ribbon beam, the member pairs adjusting a beam current density distribution in the long side direction of the ribbon beam by using an electric field or a magnetic field, each of the member pairs being disposed with the ribbon beam in-between the member pairs, wherein opposing surfaces of the member pairs adjacent to each other in the long side direction of the ribbon beam are at least partially not parallel to a traveling direction of the ribbon beam.

According to another aspect of one or more exemplary embodiments, there is provided an ion implanter comprising an ion source configured to generate a ribbon beam; a beam current density distribution adjustment device including a plurality of member pairs in a long side direction of the ribbon beam, the member pairs adjusting a beam current density distribution in the long side direction of the ribbon beam by using an electric field or a magnetic field, each of the member pairs being disposed with the ribbon beam in-between the member pairs; and a process chamber in which a wafer is disposed, wherein opposing surfaces of the member pairs adjacent to each other in the long side direction of the ribbon beam are at least partially not parallel to a traveling direction of the ribbon beam.

According to yet another aspect of one or more exemplary embodiments, there is provided a beam adjusting device comprising a first member and a second member disposed at opposite sides of a ribbon beam; and a third member and a fourth member disposed on opposite sides of the ribbon beam, the third member adjacent to the first member in a long direction of the ribbon beam, and the fourth member adjacent to the second member in the long direction, wherein each of the first through fourth members has a surface extending in a travelling direction of the ribbon beam, the travelling direction being orthogonal to the long direction, and at least a portion of the surface of the first member is not parallel to the travelling direction.

BRIEF DESCRIPTION OF THE DRAWINGS

FIG. 1A is a perspective view of the device, and FIG. 1B is a plan view illustrating a part surrounded by a dashed line in FIG. 1A in an enlarged manner;

FIGS. 2A and 2B are an explanatory diagram of a local electric field region appeared in a long side direction of a ribbon beam, where FIG. 2A is an explanatory diagram of the local electric field region formed by the beam current density distribution adjustment device of the exemplary embodiment illustrated in FIGS. 1A and 1B, and FIG. 2B is an explanatory diagram of a local electric field region formed by a related art beam current density distribution adjustment device illustrated in FIG. 11;

FIGS. 3A-3D illustrate a beam current density distribution adjustment device according to another exemplary embodiment, where FIG. 3A illustrates a configuration example in which a size of a gap between electrodes in the Y direction is varied in the Z direction, FIGS. 3B and 3C each illustrate a configuration example in which a part of an opposing surface is parallel to the Z direction, and FIG. 3D illustrates a configuration example in which an opposing surface is curved;

FIGS. 4A and 4B illustrate a beam current density distribution adjustment device according to yet another exemplary embodiment, where FIG. 4A illustrates a configuration example of a beam current density distribution adjustment device having an electrode structure axisymmetric with respect to a line C1-C1, in which inclined angles of the opposing surfaces of the respective electrodes adjacent to each other in the long side direction of the ribbon beam are alternately different for each gap of the electrodes, and FIG. 4B illustrates a configuration example of a beam current density distribution adjustment device having an electrode structure axisymmetric with respect to the line C1-C1, in which the inclined angles of the opposing surfaces of the respective electrodes adjacent to each other in the long side direction of the ribbon beam are different between upper side and lower side of the line C1-C1;

FIG. 5A illustrates an example of a beam current density distribution adjustment device having an electrode structure axisymmetric with respect to a line C2-C2, FIG. 5B illustrates a configuration example in which two electrode structures illustrated in FIG. 5A are coupled in a traveling direction of the ribbon beam, FIG. 5C illustrates an example of a beam current density distribution adjustment device having an electrode structure non-axisymmetric with respect to the line C2-C2, and FIG. 5D illustrates an example of a beam current density distribution adjustment device having a combination of the configuration example illustrated in FIG. 5A and the configuration example illustrated in FIG. 4B;

FIG. 7A is a plan view of the beam current density distribution adjustment device, and FIG. 7B is a plan view illustrating a part surrounded by a dashed line in FIG. 7A in an enlarged manner;

FIG. 8A is a perspective view of the beam current density distribution adjustment device, and FIG. 8B is a plan view of a part surrounded by a dashed line in FIG. 8A in an enlarged manner;

FIG. 9 is a plan view illustrating a configuration example of an ion implanter provided with the beam current density distribution adjustment device according to exemplary embodiments;

FIG. 10A is a perspective view of the device, and FIG. 10B is a plan view illustrating a part surrounded by a dashed line in FIG. 10A in an enlarged manner.

DESCRIPTION OF EXEMPLARY EMBODIMENTS

Figure 10A:
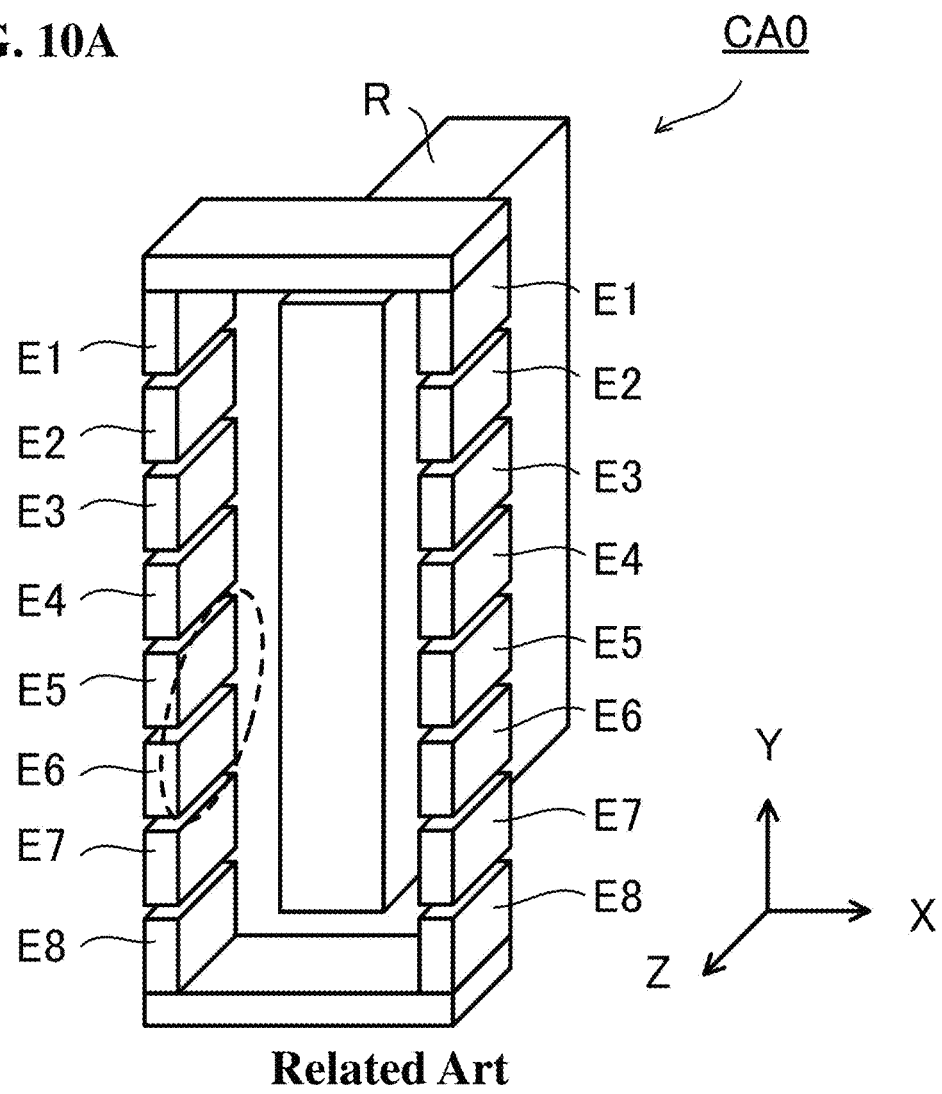
FIGS. 10A and 10B illustrate a configuration example of a related art beam current density distribution adjustment device, where

A related art beam current density distribution adjustment device CA0 is illustrated in FIG. 10A. In FIG. 10A, a direction of illustrated Z axis (Z direction) indicates a traveling direction of a ribbon beam R. When the ribbon beam R is cut on a plane perpendicular to the Z direction, the ribbon beam R has a substantially rectangular sectional surface. A direction of illustrated X axis (X direction) is a direction parallel to a short side direction of the substantially rectangular sectional surface of the ribbon beam R. Also, a direction of illustrated Y axis (Y direction) is a direction parallel to a long side direction of the substantially rectangular sectional surface of the ribbon beam R.

The related art beam current density distribution adjustment device CA0 of FIG. 10A includes a plurality of electrode pairs E1 to E8 that are arranged along the Y direction. Electrodes of each of the electrode pairs E1 to E8 are disposed with the ribbon beam R in between in the X direction. As with the device disclosed in Japanese Patent Laid-Open Application No. 2014-183042, each of the electrode pairs E1 to E8 is coupled with an unillustrated power supply, and is supplied with a predetermined voltage.

Figure 10B:
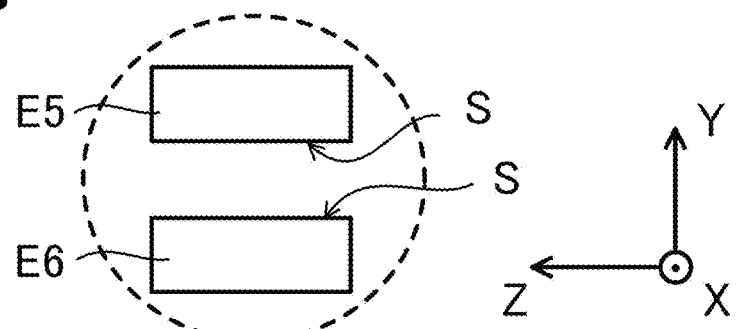

FIG. 10B illustrates a state, on a YZ plane, of one of electrodes configuring the electrode pair E5 and one of electrodes configuring the electrode pair E6 that are surrounded by a dashed line in FIG. 10A. As illustrated in FIG. 10B, opposing surfaces S of the electrodes adjacent to each other in the Y direction are parallel to the Z direction. Note that the same configuration is applied to opposing surfaces S of other electrodes not illustrated.

Figure 11:
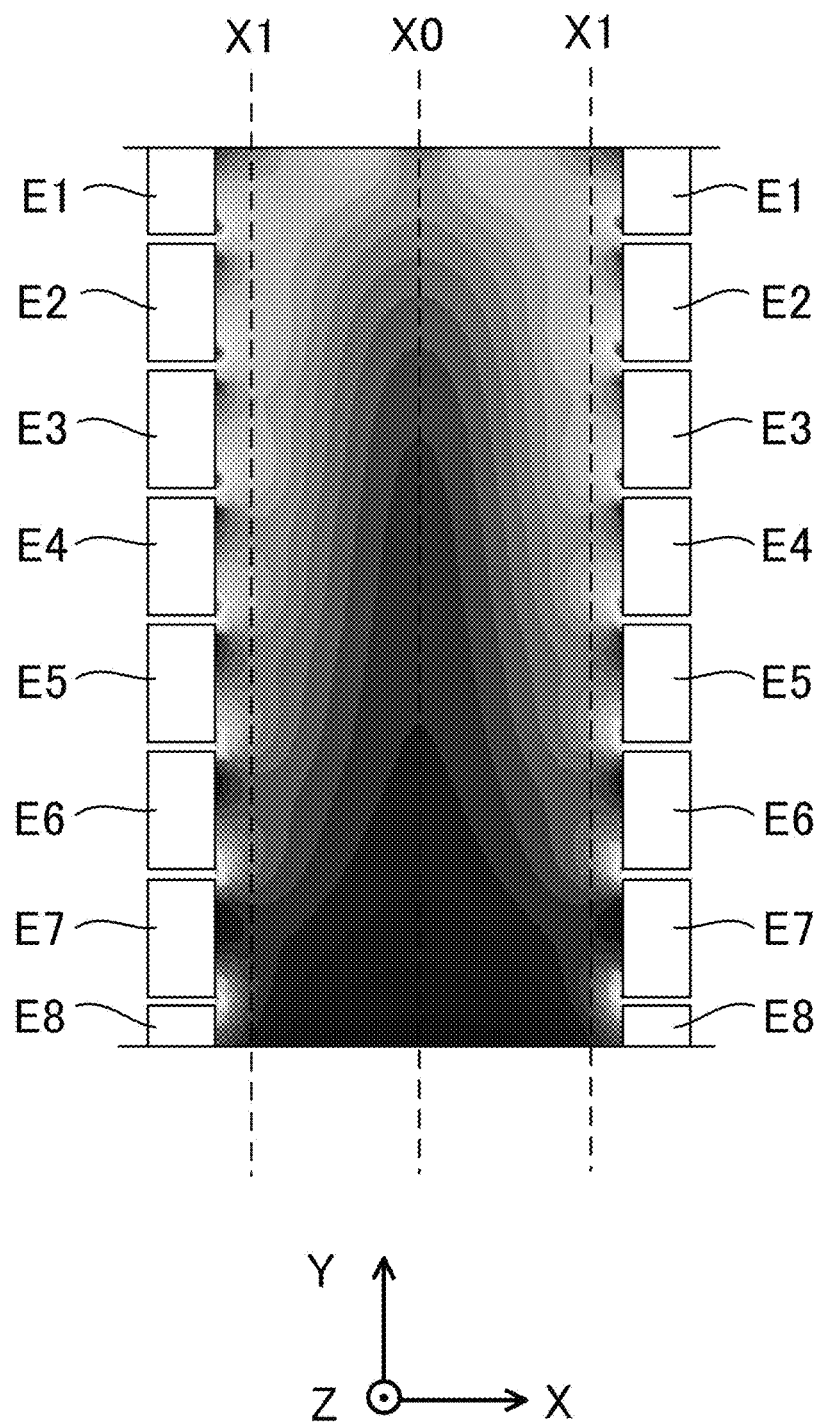
FIG. 11 illustrates an electric field distribution showing the magnitude of the total electric field in the beam current density distribution adjustment device illustrated in FIG. 10.

FIG. 11 illustrates an electric field distribution in the related art beam current density distribution adjustment device CA0 of FIG. 10A. More specifically, FIG. 11 illustrates the electric field distribution on an XY plane at a time when voltages different by 0.5 kV along the Y direction are applied to the respective electrode pairs E1 to E8. The electric field distribution is at a center position of the beam current density adjustment device CA0 in the Z direction, and electric field distribution similar to that of FIG. 11 is formed at other positions in the Z direction.

The electric field distribution substantially uniform in a stepwise manner is formed in the Y direction near a line X0 through which a center of the ribbon beam R passes. Thus, the beam current density distribution adjustment of the ribbon beam R is easily performed in the region near the line X0. In contrast, the electric field distribution formed in the Y direction near lines X1 through which respective ends of the ribbon beam R pass is largely disturbed as compared with the electric field distribution formed in the Y direction near the line X0.

The disturbance of the smoothly varying electric field is caused by the intensification of the electric field by the edge of the electrode configuring each electrode pair. As illustrated in FIG. 10B, in the related art beam current density distribution adjustment device CA0, the edge of the electrode (the opposing surface S of the electrode) is formed along the Z direction. With this relationship, a region where the electric field locally varies collectively appears, along the Z direction, at the same position of the Y direction at the ends of the X direction of the ribbon beam R that passes through the beam current density distribution adjustment device CA0. Accordingly, there is a disadvantage with the related art device in that the beam current density distribution in the Y direction easily becomes a wavy distribution at the ends of the ribbon beam R in the X direction, and it is difficult to adjust the wavy distribution to a predetermined distribution.

According to exemplary embodiments of the present disclosure, the configuration of the beam current density distribution adjustment device is improved, and the beam current density distribution in the long side direction of the ribbon beam is easily adjusted at the ends in the short side direction of the ribbon beam.

Various exemplary embodiments will now be described.

Figure 1A:
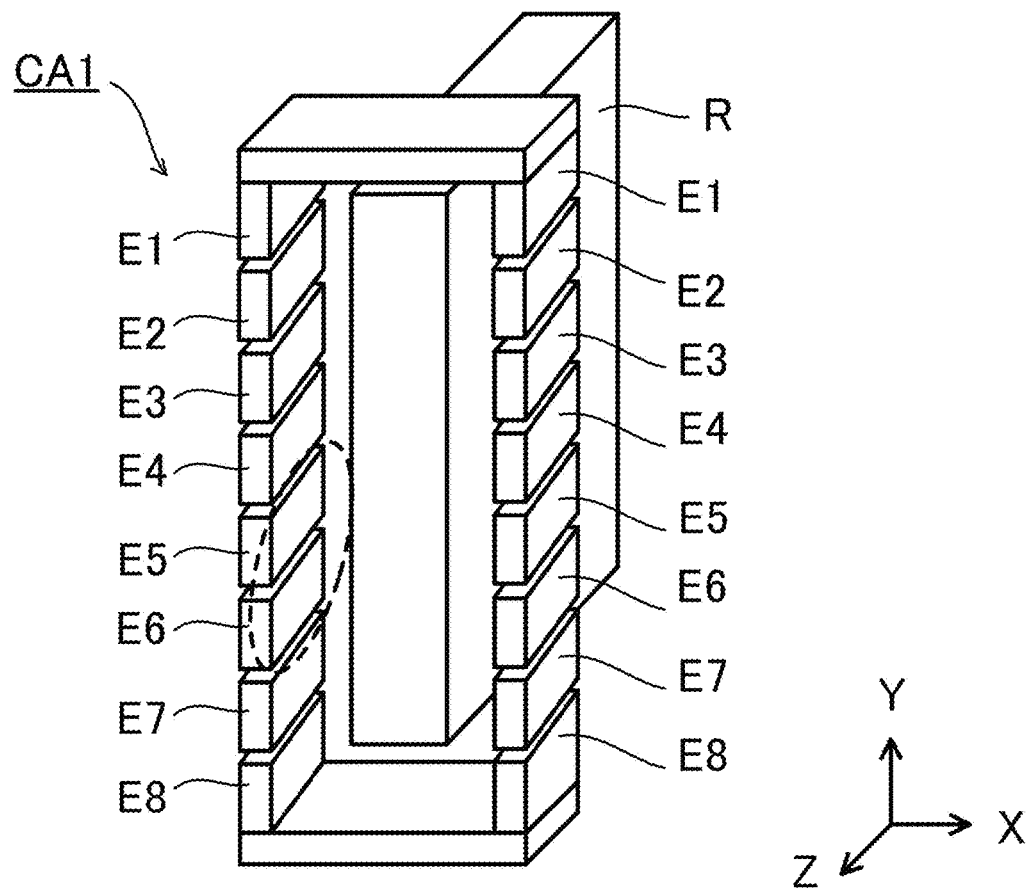
FIGS. 1A and 1B illustrate a beam current density distribution adjustment device according to an exemplary embodiment, where
Figure 1B:
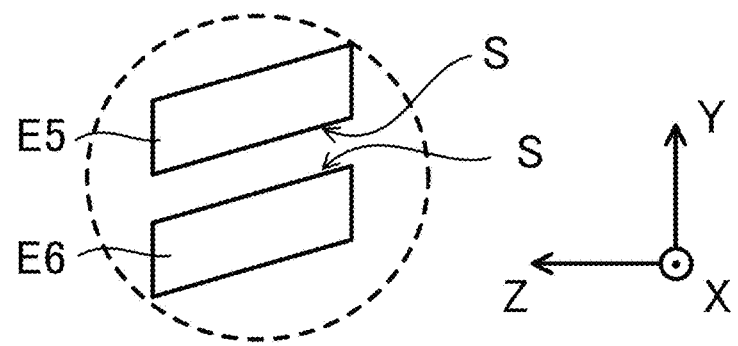

FIGS. 1A and 1B illustrate a beam current density distribution adjustment device according to an exemplary embodiment. FIG. 1A is a perspective view of the device, and FIG. 1B is a plan view illustrating a part surrounded by a dashed line in FIG. 1A in an enlarged manner. Directions of X, Y, and Z axes illustrated in FIGS. 1A and 1B and other diagrams described later are the same as those described in FIG. 10A.

A beam current density distribution adjustment device CA1 illustrated in FIG. 1A includes a plurality of electrode pairs E1 to E8 that are arranged in a long side direction (i.e., the Y-direction in FIGS. 1A and 1B) of the ribbon beam R. Electrodes of each of the electrode pairs E1 to E8 are disposed with the ribbon beam R in between. Each electrode pair E1 to E8 includes two electrodes, one electrode of the two electrodes on each side of the ribbon beam R.

FIG. 1B illustrates one of electrodes configuring the electrode pair E5 and one of electrodes configuring the electrode pair E6 of FIG. 1A. Although not illustrated in FIG. 1B, the other of the electrodes configuring the electrode pair E5 and the other of the electrodes configuring the electrode pair E6 each also have a configuration that is the same as that illustrated in FIG. 1B. Further, the electrodes configuring other electrode pairs also have the same configuration as the electrode illustrated in FIG. 1B.

In the configuration of the exemplary embodiment, opposing surfaces S of the electrodes of the electrode pairs adjacent to each other in the long side direction of the ribbon beam R are not parallel to the traveling direction (i.e., Z-direction in FIGS. 1A and 1B) of the ribbon beam R that enters the beam current density distribution adjustment device CA1. This is largely different from the related art beam current density distribution adjustment device CA0.

Effects achieved by the configuration of the exemplary embodiment are described with reference to FIGS. 2A and 2B, based on configuration difference between the exemplary embodiment and the related art.

FIG. 2A corresponds to the beam current density distribution adjustment device CA1 according to the exemplary embodiment illustrated in FIGS. 1A and 1B. FIG. 2B corresponds to the beam current density distribution adjustment device CA0 according to the related art illustrated in FIGS. 10A and 10B.

For simplification of illustration, the number of electrode pairs illustrated in FIG. 2A and FIG. 2B is different from that illustrated in FIGS. 1A and 1B and FIGS. 10A and 10B.

As described with reference to FIG. 11, the region where an electric field locally varies (hereinafter, referred to as local electric field region ER) is formed near an edge of each electrode. By contrast in the configuration of FIG. 2A, the opposing surfaces S of the respective electrodes of the electrode pairs E11 to E14 adjacent to one another in the Y direction are not parallel to the Z direction.

With this configuration, in the Y direction, the local electric field region ER does not act on the same position of the ribbon beam R that passes through the beam current density distribution adjustment device CA1.

In other words, the position of the ribbon beam R in the Y direction on which the local electric field region ER acts is changed along the Z direction. Thus, the influence of the local electric field region ER with respect to the ribbon beam R is averaged and suppressed in the Y direction of the ribbon beam R. As a result, it becomes more easy to adjust the beam current density distribution in the Y direction of the ribbon beam R, at ends of the ribbon beam R in the X direction.

In contrast, in FIG. 2B illustrating the configuration according to the related art, the opposing surfaces S of the respective electrodes of the electrode pairs E11 to E14 adjacent to one another in the Y direction are parallel to the Z direction. With this configuration, the local electric field region ER influences the same position, in the Y direction, of the ribbon beam R that passes through the beam current density distribution adjustment device CA0. As a result, the beam current density distribution tends to be wavy at the ends of the ribbon beam R in the X direction, and it is difficult to adjust the wavy distribution to a predetermined distribution.

FIGS. 3A to 3D illustrate a beam current density distribution adjustment device CA1 according to another exemplary embodiment. In FIGS. 3A to 3D and FIGS. 4A and 4B to FIG. 6 described later, configurations of various exemplary embodiments are described with use of a YZ plan view as with FIGS. 2A and 2B for simplification of illustration.

In the exemplary embodiment of FIG. 3A, a size of each of gaps between the opposing surfaces S of the electrodes of the electrode pairs E11 to E14 adjacent to one another in the Y direction is varied along the Z direction. As illustrated in FIG. 3A, the opposing surfaces S of the electrodes of the electrode pairs E11 to E14 disposed adjacently to one another in the Y direction are not parallel to each other. That is, for example, the gap between opposing surfaces S of electrodes E11 and E12 gradually increases from right to left in FIG. 3A. Even with such a configuration, it is possible to achieve the above-described effects of the exemplary embodiment.

In the case of the exemplary embodiment of FIG. 3A, the beam deflection capability (ease of bending the beam by the electric field generated between the electrodes) is also varied in association with the variation, along the Z direction, of the size of each of the gaps between the opposing surfaces S of the electrodes of the electrode pairs E11 to E14 adjacent to one another in the Y direction. This makes it more difficult to perform beam deflection control by the beam current density distribution adjustment device.

To make it more easy to perform the beam deflection control, the size of the gap between the opposing surfaces S of the electrodes of the electrode pairs adjacent to one another in the Y direction illustrated in FIGS. 1A and 1B and FIG. 2A mentioned above may be advantageously fixed along the Z direction, namely, the opposing surfaces S of the electrodes of the electrode pairs adjacent to each other in the Y direction may be advantageously parallel to each other.

In the exemplary embodiment of FIG. 3B, a part of each opposing surface S of the electrode of the electrode pairs E11 to E14 is parallel to the Z direction; however, the other part of each opposing surface S is not parallel to the Z direction. Accordingly, it is possible to achieve the above-described effects of the exemplary embodiment by the non-parallel part.

In addition, as with the exemplary embodiment of FIG. 3C, for example, a part parallel to the Y direction that is orthogonal to the Z direction may be provided between parts parallel to the Z direction of each opposing surface S of the electrode of the respective electrode pairs E11 to E14. More specifically, in the exemplary embodiment shown in FIG. 3C, it is sufficient for the opposing surface S of the electrode of each electrode pair to be parallel to the Z direction at least partially, and in other words, the opposing surface S of the electrode of each electrode pair is not linearly formed along the Z direction.

In the exemplary embodiment of FIG. 3D, the opposing surfaces S of each electrode of the electrode pairs E11 to E14 are each formed of a curved surface. In the exemplary embodiments mentioned above, it is assumed that the opposing surface S of each electrode of the electrode pairs is configured of one flat surface or a combination of a plurality of flat surfaces. Alternatively, the opposing surfaces S of any of the exemplary embodiments mentioned above may be curved as with the exemplary embodiment of FIG. 3D. Also, the shape of the opposing surface S may be a combined shape of a curved surface and a flat surface.

In the exemplary embodiments mentioned above, the opposing surfaces S of the electrodes of the electrode pairs are inclined in substantially one direction with respect to the Z direction. Since the opposing surface S of the electrodes of the electrode pairs are inclined in one direction in these configurations, the beam deflection capability of the beam current density distribution adjustment device CA1 is exerted in such a manner that the beam deflection in one direction along the Y direction is more easy and the beam deflection in the other direction is more difficult.

In the exemplary embodiments mentioned above, it may be slightly more difficult to adjust the beam current density distribution because of such an irregularity of the beam deflection capability.

Thus, to eliminate the above-described irregularity of the beam deflection capability to more easily perform the beam current density distribution adjustment in the Y direction, the configuration of the exemplary embodiment illustrated in FIGS. 4A and 4B may be employed.

In FIG. 4A, the opposing surfaces S of the electrodes of the electrode pairs E21 to E27 are so configured as to be axisymmetric with respect to the line C1-C1 that indicates a center of the beam current density distribution adjustment device in the Y direction. More specifically, the opposing surfaces S of the electrodes of the electrode pairs E21 to E27 adjacent to one another in the Y direction are configured such that the inclination directions with respect to the Z direction are alternately reversed at the same inclined angle. That is, as shown in FIG. 4A, the opposing surfaces S between electrodes E21 and E22 incline upward from left to right, whereas the opposing surfaces S between electrodes E22 and E23 decline downward from left to right, and so on. Such a configuration allows the beam deflection capability in the Y direction to be averaged, which makes it more easy to adjust the beam current density distribution as compared with the configurations of the exemplary embodiments mentioned above.

It is possible to improve the irregularity of the beam deflection capability by the configuration of FIG. 4B without limitation to the configuration of FIG. 4A. In FIG. 4B, the opposing surfaces S of electrodes of the electrode pairs E21 to E27 are so configured as to be axisymmetric with respect to the line C1-C1 that indicates the center of the beam current density distribution adjustment device in the Y direction.

Further, in the exemplary embodiment of FIG. 4B, the inclination direction of the opposing surfaces S with respect to the Z direction on one side of the line C1-C1 serving as a boundary in the Y direction is different from the inclination direction on the other side.

The exemplary embodiment of FIGS. 4A and 4B may suppress irregularity of the beam deflection capability in the Y direction; however, an irregularity of the beam deflection capability may also occur in the Z direction. To suppress the irregularity of the beam deflection capability in the Z direction, exemplary embodiments illustrated in FIGS. 5A to 5D may be employed.

Figure 5A:
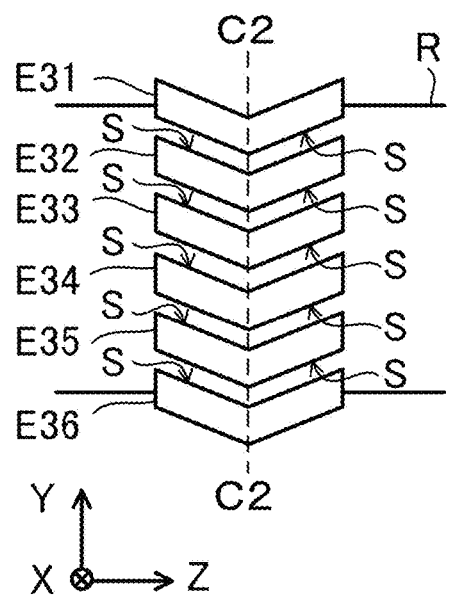
FIGS. 5A-5D illustrate a beam current density distribution adjustment device according to yet another exemplary embodiment, where

A line C2-C2 illustrated in the exemplary embodiments of FIGS. 5A to 5D indicates a center of the beam current density distribution adjustment device CA1 in the Z direction. In FIG. 5A, the opposing surfaces S of the electrodes of the electrode pairs E31 to E36 are configured to be axisymmetric with respect to the line C2-C2.

Figure 5B:
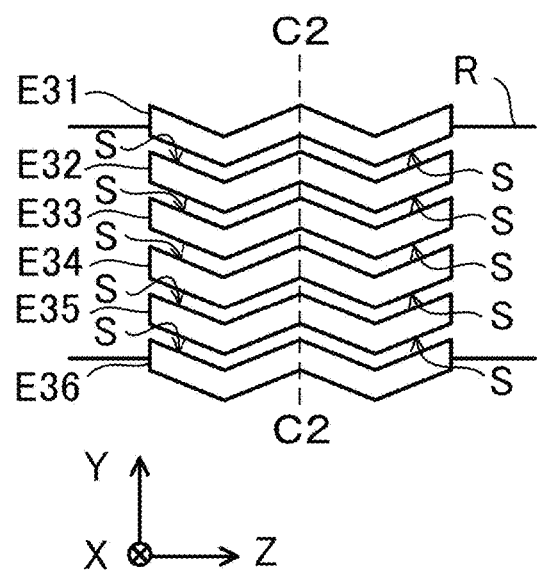

The exemplary embodiment of FIG. 5A has a configuration in which the opposing surface S of each electrode of the electrode pairs forms substantially V-shape. That is, the opposing surface S of each electrode forms a chevron shape. Alternatively, as illustrated in FIG. 5B, a configuration in which two configurations of FIG. 5A are coupled in the Z direction to form a W-shape (side-by-side chevrons) allows the beam deflection capability in the Z direction to be averaged. A similar effect is obtainable even when three or more configurations are coupled.

Figure 5C:
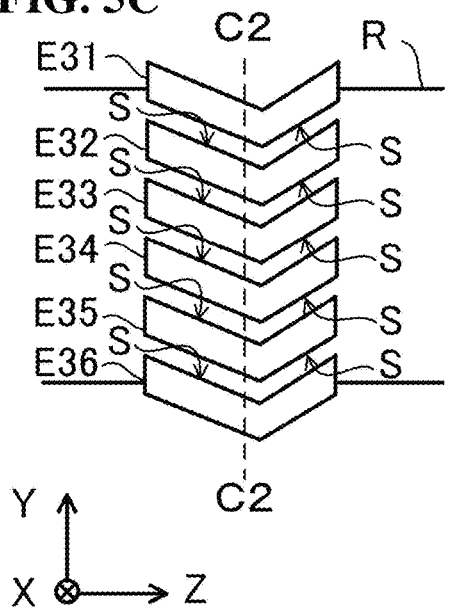
Figure 5D:
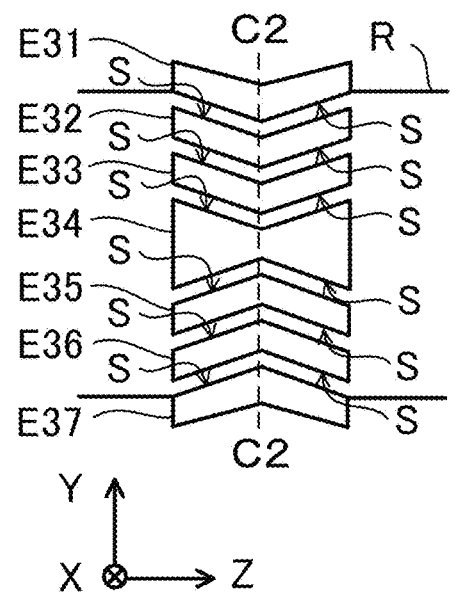

The exemplary embodiment illustrated in FIG. 5C may be also employed to suppress the irregularity of the beam deflection capability in the Z direction. In the exemplary embodiment of FIG. 5C, the opposing surface S of each electrode of the electrode pairs E31 to E36 is configured to be non-axisymmetric with respect to the line C2-C2. The configuration of the exemplary embodiment illustrated in FIG. 5D is configured by coupling two configurations of the exemplary embodiment of FIG. 4B. That is, as shown in FIG. 5D, the configuration of FIG. 4B is provided on the left side of the line C2-C2, and a mirror image of the configuration of FIG. 4B is provided on the right side of the line C2-C2. Even in the case of the exemplary embodiment illustrated in FIG. 5D, it is possible to suppress irregularity of the beam deflection capability in the Z direction. Two or more configurations of the exemplary embodiments illustrated in FIGS. 5C and 5D may be coupled.

The configurations of the respective exemplary embodiments illustrated in FIGS. 5A to 5D are configurations in which the opposing surfaces S of the electrodes of the electrode pairs adjacent to each other in the Y direction intersect with the Z direction an even number of times, and the opposing surfaces S of the electrodes of the electrode pairs adjacent to each other in the Y direction are inclined in one direction with respect to the Z direction. Such configuration makes it possible to suppress irregularity of the beam deflection capability in the Z direction.

The inclination degrees, with respect to the Z direction, of the opposing surfaces S of the electrodes of the electrode pairs adjacent to each other in the Y direction may be determined in the following manner.

Figure 6:
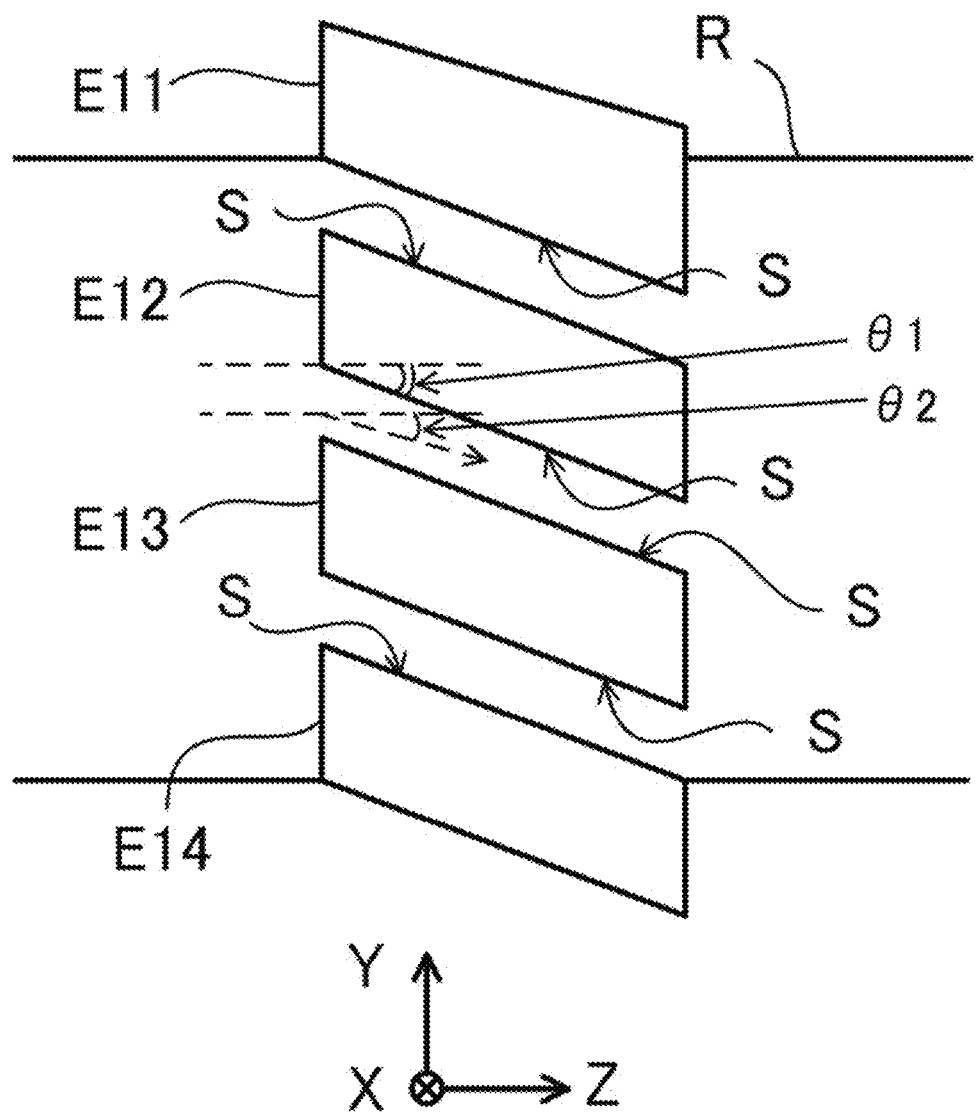
FIG. 6 is an explanatory diagram relating to a method of setting the inclined angles of the opposing surfaces of the electrodes adjacent to each other in the long side direction of the ribbon beam.

FIG. 6 illustrates a same structure as the electrode structure illustrated in the exemplary embodiment of FIG. 2A. In FIG. 6, the ribbon beam R is locally deflected at an angle θ2 with respect to the Z direction between the electrode pair E12 and the electrode pair E13.

Also, the opposing surfaces S of the electrodes of the electrode pairs adjacent to each other in the Y direction are inclined at an angle θ1 with respect to the Z direction. When the angle θ2 is equal to the angle θ1 in this exemplary embodiment, the beam component deflected between the electrode pair E12 and the electrode pair E13 constantly passes through a strong electric field region after deflection. This may adversely affect adjustment of the beam current density distribution.

Thus, the inclined angle of the opposing surface S with respect to the Z direction is so set as to be non-parallel to the deflection direction, taking into consideration the deflection direction of the ribbon beam R.

More specifically, the angle θ2 at which the beam is deflected with respect to the Z direction is regarded as a maximum beam deflection angle supposed in the electrodes, and the inclined angle θ1 of the opposing surface S is determined to be larger than the angle θ2.

Such determination of the inclined angle makes the traveling direction of the deflected beam component be non-parallel to the opposing surface S. Accordingly, it is possible to prevent the strong electric field region from constantly acting on the deflected beam component.

If the divergence of the ribbon beam R caused by virtue of the space-charge effect is suppressed to parallel or converge the entire shape of the ribbon beam in the Y direction, the ribbon beam R is deflected at larger angle as the ribbon beam R goes from the center part to the both ends in the Y direction. In this case, the beam deflection angle θ2 gradually increases from center toward the both ends. Thus, the inclined angle θ1 of the opposing surface S is set to be gradually increased accordingly.

In this way, the inclined angle θ1 of the opposing surface S may be determined depending on the position of the ribbon beam R in the Y direction.

In the exemplary embodiments mentioned above, the beam current density distribution adjustment device is provided with electrode pairs. Alternatively, the exemplary embodiment may be applied to a configuration of other known beam current density distribution adjustment device.

For example, it is known from simulation by the inventors that a region where a magnetic field locally varies is formed in an edge region of a member generating the magnetic field in a beam current density distribution adjustment device that adjusts the beam current density distribution in the Y direction with use of not the electric field but the magnetic field.

Accordingly, beam current density distribution adjustment devices CA2 and CA3 that each adjust the beam current density distribution in the Y direction by the magnetic field illustrated in FIGS. 7A and 7B and FIGS. 8A and 8B may be used.

Figure 7A:
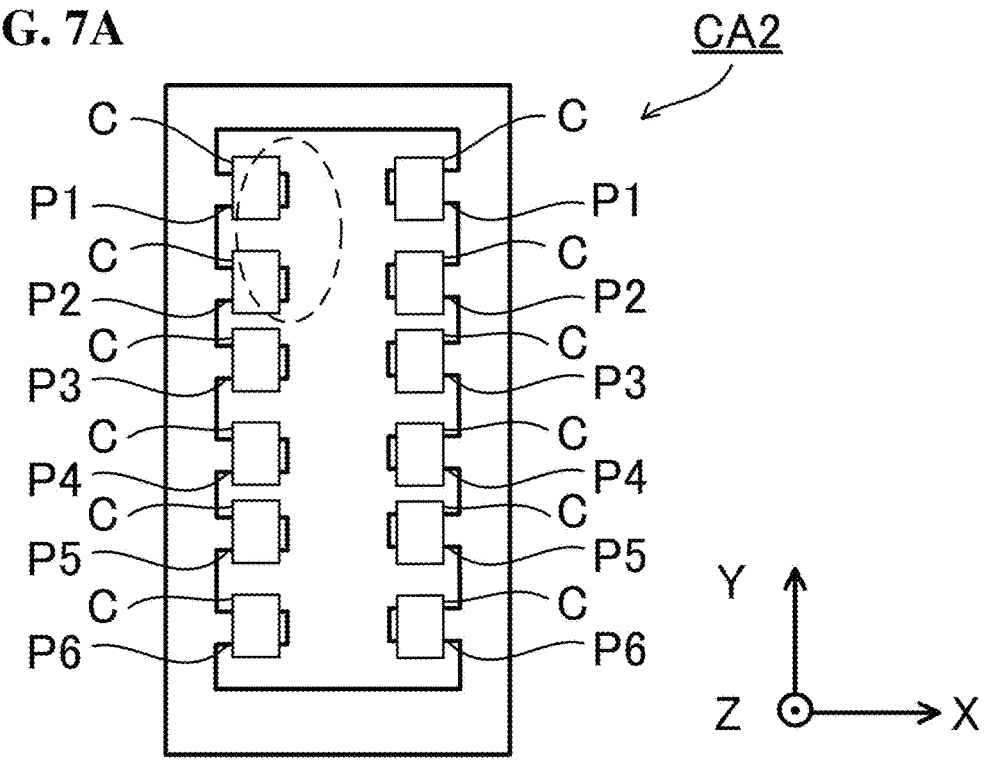
FIGS. 7A and 7B illustrate a beam current density distribution adjustment device according to yet another exemplary embodiment, where

FIG. 7A illustrates a beam current density distribution adjustment device CA2 according to an exemplary embodiment. The device includes a plurality of magnetic pole pairs P1 to P6 that are arranged along the Y direction, and each magnetic pole is wound with a coil C. An unillustrated ribbon beam R passes between the paired magnetic poles that are disposed oppositely in the X direction. Each magnetic pole pair P1 to P6 includes two magnetic poles, one magnetic pole of the two magnetic poles on each side of the ribbon beam.

Figure 7B:
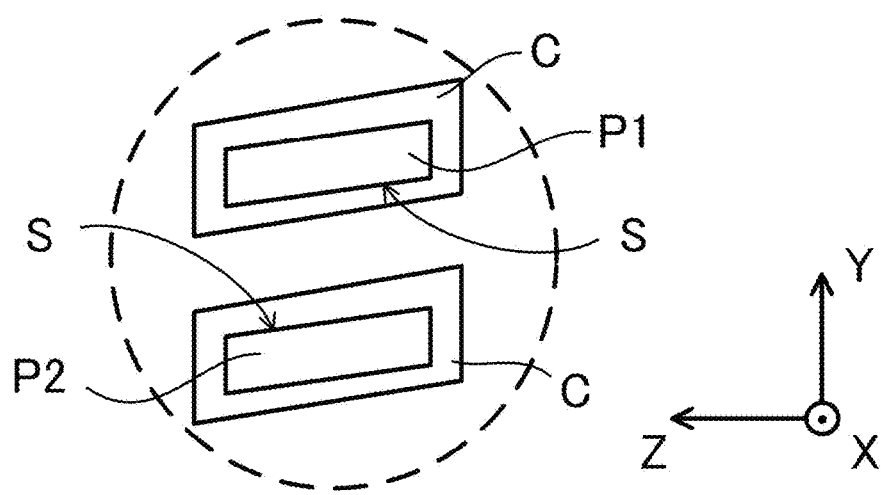

FIG. 7B illustrates one of the magnetic poles configuring the magnetic pole pair P1 and one of the magnetic poles configuring the magnetic pole pair P2. Although not illustrated in FIG. 7B, the other of the magnetic poles configuring the magnetic pole pair P1 and the other of the magnetic poles configuring the magnetic pole pairs P2 each also have the same configuration as that illustrated in FIG. 7B. In addition, the magnetic poles configuring the other magnetic pairs also have the same configuration as the magnetic pole illustrated in FIG. 7B.

Figure 8A:
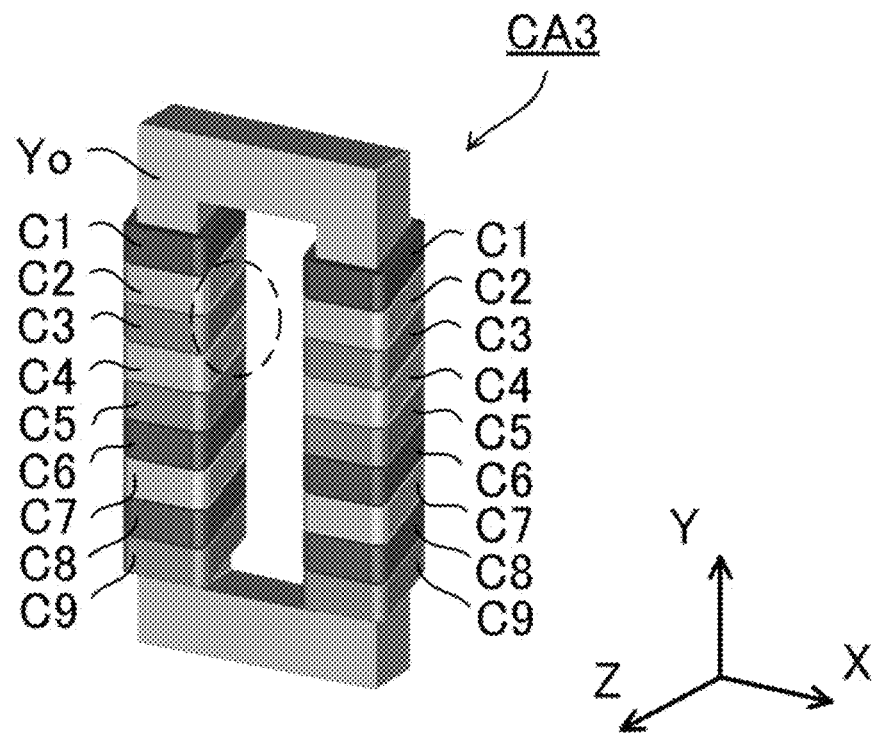
FIGS. 8A and 8B illustrate a beam current density distribution adjustment device according to yet another exemplary embodiment, where

FIG. 8A illustrate a beam current density distribution adjustment device CA3 according to another exemplary embodiment. The device includes a plurality of coil pairs C1 to C9. Each coil of the coil pairs C1 to C9 is wound around a shaft, parallel to the Y direction, of a rectangular-shaped yoke Yo. An unillustrated ribbon beam R passes between the paired coils disposed oppositely in the X direction. Each coil pair C1 to C9 includes two coils, one coil of the two coils on each shaft side of the yoke Yo.

Figure 8B:
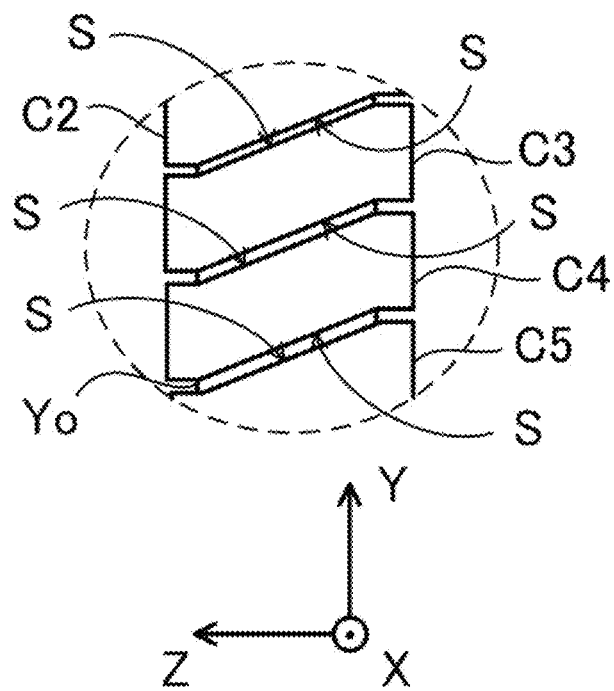

FIG. 8B illustrates coils on one shaft side out of the coils configuring the coil pairs C2 to C5. The coils on the other shaft side out of the coils configuring the coil pairs C2 to C5 and the coils configuring the other coil pairs each have a same shape as the coil shape illustrated in FIG. 8B.

Making the opposing surface S of each coil of the coil pairs C2 to C5 be non-parallel to the Z direction makes it possible to achieve the effects of the exemplary embodiment described in the description of FIGS. 1A and 1B and FIG. 2A described above.

Further, the other exemplary embodiments described with reference to FIG. 3A to FIG. 6 may be applied to the beam current density distribution adjustment devices CA2 and CA3 each adjusting the beam current density distribution in the Y direction by the magnetic field, illustrated in FIGS. 7A and 7B and FIGS. 8A and 8B.

As a configuration example of an ion implanter provided with any of the beam current density distribution adjustment devices CA1 to CA3 of the exemplary embodiments mentioned above, a configuration illustrated in FIG. 9 may be available.

An ion implanter IM illustrated in FIG. 9 generates the ribbon beam R by an ion source 1, and uses a mass analyzing magnet 2 and a resolving aperture 3 to remove unnecessary ions from the ribbon beam R.

After analysis, any of the beam current density distribution adjustment devices CA1 to CA3 of the above-described exemplary embodiments may be applied to adjust the current density distribution of the ribbon beam R.

The ribbon beam R subjected to the beam current density distribution adjustment may be applied to a wafer W that is mechanically scanned along an arrow direction in a process chamber 4.

Note that, in the configuration illustrated in FIG. 9, when the ion implanter is not of mass analyzing type, the mass analyzing magnet 2 and the resolving aperture 3 may be omitted. In that case, as a minimum unit configuring the ion implanter IM, the ion source 1, any of the beam current density distribution adjustment devices CA1 to CA3 according to the above-described exemplary embodiments, and the process chamber 4 may be used.

As compared with the related art device, the beam current density distribution adjustment devices CA1 to CA3 of the exemplary embodiments each more easily adjust the beam current density distribution of the ribbon beam in the Y direction at the ends in the X direction.

Accordingly, the beam amount of the ribbon beam having a beam current density distribution may be increased and a time for ion implantation to the wafer W may therefore be reduced.

A beam current density distribution adjustment device according to an exemplary embodiment includes a plurality of member pairs in a long side direction of a ribbon beam and adjusts beam current density distribution in the long side direction of the ribbon beam with use of an electric field or a magnetic field. Members of each of the member pairs are disposed with the ribbon beam in between. Opposing surfaces of the member pairs adjacent to each other in the long side direction of the ribbon beam are not parallel to a traveling direction of the ribbon beam at least partially. At a position where the opposing surface is not parallel to the traveling direction of the ribbon beam, the region where the electric field or the magnetic field locally varies does not act on the same position of the ribbon beam. In other words, the position on which the region where the electric field or the magnetic field locally varies in the long side direction of the ribbon beam acts is changed along the traveling direction of the ribbon beam. Accordingly, the influence, with respect to the ribbon beam, of the region where the electric field or the magnetic field locally varies is not concentrated in the same position in the long side direction of the ribbon beam, and is averaged and reduced. As a result, it becomes more easy to adjust the beam current density distribution in the long side direction of the ribbon beam, at the ends in the short side direction of the ribbon beam.

The opposing surfaces of the member pairs adjacent to each other in the long side direction of the ribbon beam may be parallel to each other.

In contrast, the opposing surfaces of the member pairs adjacent to each other in the long side direction of the ribbon beam may be not parallel to each other.

To further reduce influence, with respect to the ribbon beam, of the region where the electric field or the magnetic field locally varies, the entire opposing surfaces of the member pairs adjacent to each other in the long side direction of the ribbon beam may be advantageously not parallel to the traveling direction of the ribbon beam.

In considering the local beam deflection capability of the beam current density distribution adjustment device, the opposing surfaces of the member pairs adjacent to each other in the long side direction of the ribbon beam may be advantageously inclined in one direction with respect to the traveling direction of the ribbon beam, and may be advantageously substantially symmetrical with respect to the center of each opposing surface in the traveling direction of the ribbon beam. This configuration makes it possible to uniform the beam deflection capability in both directions along the long side direction of the ribbon beam, in the traveling direction of the ribbon beam.

Further, the opposing surfaces of the member pairs adjacent to each other in the long side direction of the ribbon beam may be advantageously inclined in one direction with respect to the traveling direction of the ribbon beam, and may advantageously intersect with the traveling direction of the ribbon beam an even number of times. This configuration makes it possible to suppress irregularity of the beam deflection capability in the both directions along the long side direction of the ribbon beam, in the traveling direction of the ribbon beam.

The opposing surfaces of the member pairs adjacent to each other in the long side direction of the ribbon beam may be advantageously inclined at the same angle with respect to the traveling direction of the ribbon beam. This configuration is a simple configuration in which each opposing surface is configured of a flat surface or a combination of flat surfaces. In addition, this configuration makes the beam deflection capability between the opposing surfaces uniform along the traveling direction of the ribbon beam, thereby allowing the beam current density distribution adjustment device to more easily perform the beam deflection control.

Further, the inclined angle may be advantageously set to be non-parallel to the deflection direction of the ribbon beam that has been deflected between the member pairs. When the deflection direction of the beam component that has been locally deflected is parallel to the opposing surfaces of the member pairs adjacent to each other, the beam component that has been locally deflected constantly passes through the region where the electric field or the magnetic field locally varies, while the ribbon beam passes through the beam current density distribution adjustment device. This may adversely affect adjustment of the beam current density distribution. Thus, when the inclined angles of the opposing surfaces with respect to the traveling direction of the ribbon beam are so set as to be non-parallel to the deflection direction in consideration of the deflection direction of the ribbon beam, it is possible to prevent the region where the electric field or the magnetic field locally varies from intensively acting on the deflected beam component that configures a part of the ribbon beam passing through the beam current density distribution adjustment device.

To more easily perform the beam current density distribution adjustment in the long side direction of the ribbon beam, the opposing surfaces of the member pairs adjacent to each other in the long side direction of the ribbon beam may be advantageously inclined in one direction with respect to the traveling direction of the ribbon beam, and may be advantageously symmetrical with the center of the beam current density distribution adjustment device in the long side direction of the ribbon beam. This configuration makes it possible to perform beam deflection control symmetrically on both sides of the center of the ribbon beam in the long side direction of the ribbon beam. Accordingly, it becomes more easy to adjust the beam current density distribution in that direction.

An ion implanter according to the exemplary embodiment includes an ion source configured to generate a ribbon beam; a beam current density distribution adjustment device including a plurality of member pairs in a long side direction of the ribbon beam and adjusting beam current density distribution in the long side direction of the ribbon beam with use of an electric field or a magnetic field, members of each of the member pairs are disposed with the ribbon beam in between; and a process chamber in which a wafer is disposed, in which, in the beam current density distribution adjustment device, opposing surfaces of the members of the member pairs adjacent to each other in the long side direction of the ribbon beam are not parallel to a traveling direction of the ribbon beam at least partially.

At a position where the opposing surfaces of the members disposed adjacently to each other in the long side direction of the ribbon beam are not parallel to the traveling direction of the ribbon beam, influence, with respect to the ribbon beam, of the region where the electric field or the magnetic field locally varies is averaged and reduced in the long side direction of the ribbon beam. As a result, it becomes easy to adjust the beam current density distribution in the long side direction of the ribbon beam, at the ends in the short side direction of the ribbon beam.

A ribbon beam in the exemplary embodiments is not limited to a fixed ribbon beam. It includes a scanned spot beam, which is scanned by an electric or magnetic scanner along a direction. The beam current density distribution adjustment devices CA1 to CA3 is also used to correct angular and/or variation of a scanned spot beam. In this case, a scanner is placed upstream of the beam current density distribution adjustment devices CA1 to CA3 along an ion beam transport path, and scanning direction of a spot beam is coincide with a long side direction of a ribbon beam in the exemplary embodiments.

Other than the above description, various improvements and modifications may be made without departing from the scope of the exemplary embodiments as defined by the claims.

What is claimed is:

1. A beam current density distribution adjustment device comprising:
   a plurality of member pairs in a long side direction of a ribbon beam, the member pairs adjusting a beam current density distribution in the long side direction of the ribbon beam by using an electric field or a magnetic field, each of the member pairs being disposed with the ribbon beam in-between the member pairs,
   wherein opposing surfaces of the member pairs adjacent to each other in the long side direction of the ribbon beam are at least partially not parallel to a traveling direction of the ribbon beam.

2. The beam current density distribution adjustment device according to claim 1, wherein the opposing surfaces of the member pairs adjacent to each other in the long side direction of the ribbon beam are parallel to each other.

3. The beam current density distribution adjustment device according to claim 1, wherein the opposing surfaces of the member pairs adjacent to each other in the long side direction of the ribbon beam are not parallel to each other.

4. The beam current density distribution adjustment device according to claim 1, wherein the entire opposing surfaces of the member pairs adjacent to each other in the long side direction of the ribbon beam are not parallel to the traveling direction of the ribbon beam.

5. The beam current density distribution adjustment device according to claim 2, wherein the entire opposing surfaces of the member pairs adjacent to each other in the long side direction of the ribbon beam are not parallel to the traveling direction of the ribbon beam.

6. The beam current density distribution adjustment device according to claim 4, wherein the opposing surfaces of the member pairs adjacent to each other in the long side direction of the ribbon beam are inclined in one direction with respect to the traveling direction of the ribbon beam, and are substantially symmetrical with respect to a center of each of the opposing surfaces in the traveling direction of the ribbon beam.

7. The beam current density distribution adjustment device according to claim 4, wherein the opposing surfaces of the member pairs adjacent to each other in the long side direction of the ribbon beam are inclined in one direction with respect to the traveling direction of the ribbon beam, and intersect with the traveling direction of the ribbon beam an even number of times.

8. The beam current density distribution adjustment device according to claim 4, wherein each of the opposing surfaces of the member pairs adjacent to each other in the long side direction of the ribbon beam are inclined at a same angle with respect to the traveling direction of the ribbon beam.

9. The beam current density distribution adjustment device according to claim 8, wherein the inclined angle is determined depending on a position at which the member pair is disposed in the long side direction of the ribbon beam.

10. The beam current density distribution adjustment device according to claim 1, wherein the opposing surfaces of the member pairs adjacent to each other in the long side direction of the ribbon beam are inclined in one direction with respect to the traveling direction of the ribbon beam, and are symmetrical with respect to a center of the beam current density distribution adjustment device in the long side direction of the ribbon beam.

11. An ion implanter comprising:
an ion source configured to generate a ribbon beam;
a beam current density distribution adjustment device including a plurality of member pairs in a long side direction of the ribbon beam, the member pairs adjusting a beam current density distribution in the long side direction of the ribbon beam by using an electric field or a magnetic field, each of the member pairs being disposed with the ribbon beam in-between the member pairs; and
a process chamber in which a wafer is disposed,
wherein opposing surfaces of the member pairs adjacent to each other in the long side direction of the ribbon beam are at least partially not parallel to a traveling direction of the ribbon beam.

12. A beam adjusting device comprising:
a first member and a second member disposed at opposite sides of a ribbon beam; and
a third member and a fourth member disposed on opposite sides of the ribbon beam, the third member adjacent to the first member in a long direction of the ribbon beam, and the fourth member adjacent to the second member in the long direction,
wherein each of the first through fourth members has a surface extending in a travelling direction of the ribbon beam, the travelling direction being orthogonal to the long direction, and
at least a portion of the surface of the first member is not parallel to the travelling direction.

13. The device according to claim 12, wherein the first through fourth members are electrodes, magnetic poles, or coils.

14. The device according to claim 12, wherein the entire surface of the first member is not parallel to the travelling direction.

15. The device according to claim 12, wherein a portion of the surface of the first member is parallel to the travelling direction.

16. The device according to claim 12, wherein a portion of the first surface is orthogonal to the travelling direction.

17. The device according to claim 12, wherein a portion of the first surface is curved.

18. The device according to claim 12, wherein each of the first through fourth members has a chevron shape.

19. The device according to claim 12, wherein the surface of the first member and the surface of the third member oppose each other and have a gap therebetween, and the gap gradually increases in the travelling direction.

20. The device according to claim 19, further comprising a fifth member and a sixth member disposed on opposite sides of the ribbon beam, the fifth member being adjacent to the third member in the long direction of the ribbon beam, wherein each of the fifth member and the sixth member has a surface extending in the travelling direction, and another surface of the third member that extends in the travelling direction and the surface of the fifth member oppose each other and have a gap therebetween, and the gap gradually decreasing in the travelling direction.

* * * * *